(12) United States Patent
Cho et al.

(10) Patent No.: US 9,922,912 B1
(45) Date of Patent: Mar. 20, 2018

(54) PACKAGE FOR DIE-BRIDGE CAPACITOR

(71) Applicant: Infineon Technologies Americas Corp., El Segundo, CA (US)

(72) Inventors: Eung San Cho, Torrance, CA (US); Danny Clavette, Greene, RI (US); Darryl Galipeau, Warwick, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/258,819

(22) Filed: Sep. 7, 2016

(51) Int. Cl.
| | |
|---|---|
| H01L 25/16 | (2006.01) |
| H01L 23/495 | (2006.01) |
| H01L 23/64 | (2006.01) |
| H01L 21/48 | (2006.01) |
| H01L 21/56 | (2006.01) |
| H01L 23/31 | (2006.01) |
| H02M 3/158 | (2006.01) |

(52) U.S. Cl.
CPC .... *H01L 23/49589* (2013.01); *H01L 21/4825* (2013.01); *H01L 21/4828* (2013.01); *H01L 21/565* (2013.01); *H01L 23/3114* (2013.01); *H01L 23/4952* (2013.01); *H01L 23/49503* (2013.01); *H01L 23/49548* (2013.01); *H01L 23/49562* (2013.01); *H01L 23/49575* (2013.01); *H01L 23/645* (2013.01); *H02M 3/158* (2013.01)

(58) Field of Classification Search
None
See application file for complete search history.

(56) References Cited

U.S. PATENT DOCUMENTS

| | | | |
|---|---|---|---|
| 7,005,325 B2 | 2/2006 | Chow et al. | |
| 7,732,919 B2 | 6/2010 | Shimizu et al. | |
| 7,960,816 B2 | 6/2011 | Chow et al. | |
| 9,228,860 B2 | 1/2016 | Sharma et al. | |
| 2017/0012030 A1* | 1/2017 | Wang | H01L 25/162 |

FOREIGN PATENT DOCUMENTS

| | | |
|---|---|---|
| JP | 2002124616 A | 4/2002 |
| JP | 2004296624 A | 10/2004 |

* cited by examiner

*Primary Examiner* — Long Pham
(74) *Attorney, Agent, or Firm* — Shumaker & Sieffert, P.A.

(57) ABSTRACT

In some examples, a device comprises a first leadframe segment, a second leadframe segment, and a first transistor, wherein the first transistor is electrically connected to the first leadframe segment. The device further comprises a second transistor, wherein the second transistor is electrically connected to the second leadframe segment. The device further comprises a conductive element, wherein the conductive element is electrically connected to the first transistor and the second transistor. The device further comprises a capacitor, wherein a first end of the capacitor is electrically connected to the first leadframe segment and a second end of the capacitor is electrically connected to the second leadframe segment.

20 Claims, 11 Drawing Sheets

PACKAGE FOR DIE-BRIDGE CAPACITOR

TECHNICAL FIELD

This disclosure relates to semiconductor packaging, and more specifically, to semiconductor packages for power electronics.

BACKGROUND

A half-bridge circuit may include two analog devices or switches. Half-bridge circuits may be used in power supplies for motors, in rectifiers, and for power conversion. Each half-bridge circuit package has several contacts and may include several conductive paths to connect the contacts to each other and to external components.

A half-bridge circuit may experience ringing if the circuit is underdamped. The ringing may occur approximately when one device of the half-bridge circuit closes and the other device opens. One method for minimizing the impact of ringing is to reduce the turn-on times of the devices. Another method to minimize the ringing is to reduce the size of a package for the half-bridge circuit and implement a decoupling capacitor attached to the printed-circuit-board voltage input.

SUMMARY

This disclosure describes techniques for a device comprising a first leadframe segment, a second leadframe segment, and a first transistor, wherein the first transistor is electrically connected to the first leadframe segment. The device further comprises a second transistor, wherein the second transistor is electrically connected to the second leadframe segment. The device further comprises a conductive element, wherein the conductive element is electrically connected to the first transistor and the second transistor. The device further comprises a capacitor, wherein a first end of the capacitor is electrically connected to the first leadframe segment and a second end of the capacitor is electrically connected to the second leadframe segment.

In some examples, a method comprises electrically connecting a first transistor to a first leadframe segment, and electrically connecting a second transistor to a second leadframe segment. The method further comprises electrically connecting a conductive element to the first transistor and the second transistor. The method further comprises electrically connecting a first end of a capacitor to the first leadframe segment, and electrically connecting a second end of the capacitor to the second leadframe segment.

In some examples, a power converter device comprises an input-voltage leadframe segment, a reference-voltage leadframe segment, and a high-side transistor, wherein a high-side drain terminal of the high-side transistor is electrically connected to the input-voltage leadframe segment. The power converter device further comprises a low-side transistor, wherein a low-side source terminal of the low-side transistor is electrically connected to the reference-voltage leadframe segment. The power converter device further comprises a conductive element, wherein the conductive element is electrically connected to a high-side source terminal of the high-side transistor and a low-side drain terminal of the low-side transistor. The power converter device further comprises a capacitor, wherein a high side of the capacitor is electrically connected to the input-voltage leadframe segment, a low side of the capacitor is electrically connected to the reference-voltage leadframe segment, a first distance between the high-side drain terminal and the high side of the capacitor is less than approximately four hundred micrometers, and a second distance between the low-side source terminal and the low side of the capacitor is less than approximately four hundred micrometers.

The details of one or more examples are set forth in the accompanying drawings and the description below. Other features, objects, and advantages will be apparent from the description and drawings, and from the claims.

DETAILED DESCRIPTION

A half-bridge circuit may include parasitic capacitances and parasitic inductances defined by the components and connections of the half-bridge circuit. A capacitor connected between the input-voltage node and the reference-voltage node may reduce the effect of parasitics on the half-bridge circuit. In some examples, the distance between each transistor of the half-bridge circuit and the capacitor may influence the effectiveness of the capacitor. In some examples, connecting the capacitor directly to the transistor leadframe segments may substantially improve the operation of the half-bridge circuit at high frequencies by reducing the ringing and resonant peaks that may occur when switching between transistors. By reducing the effect of parasitics in the half-bridge circuit, the circuit may be designed to include transistors with lower breakdown voltages, lower resistances, and lower power consumption, while maintaining or improving performance.

Figure 1:
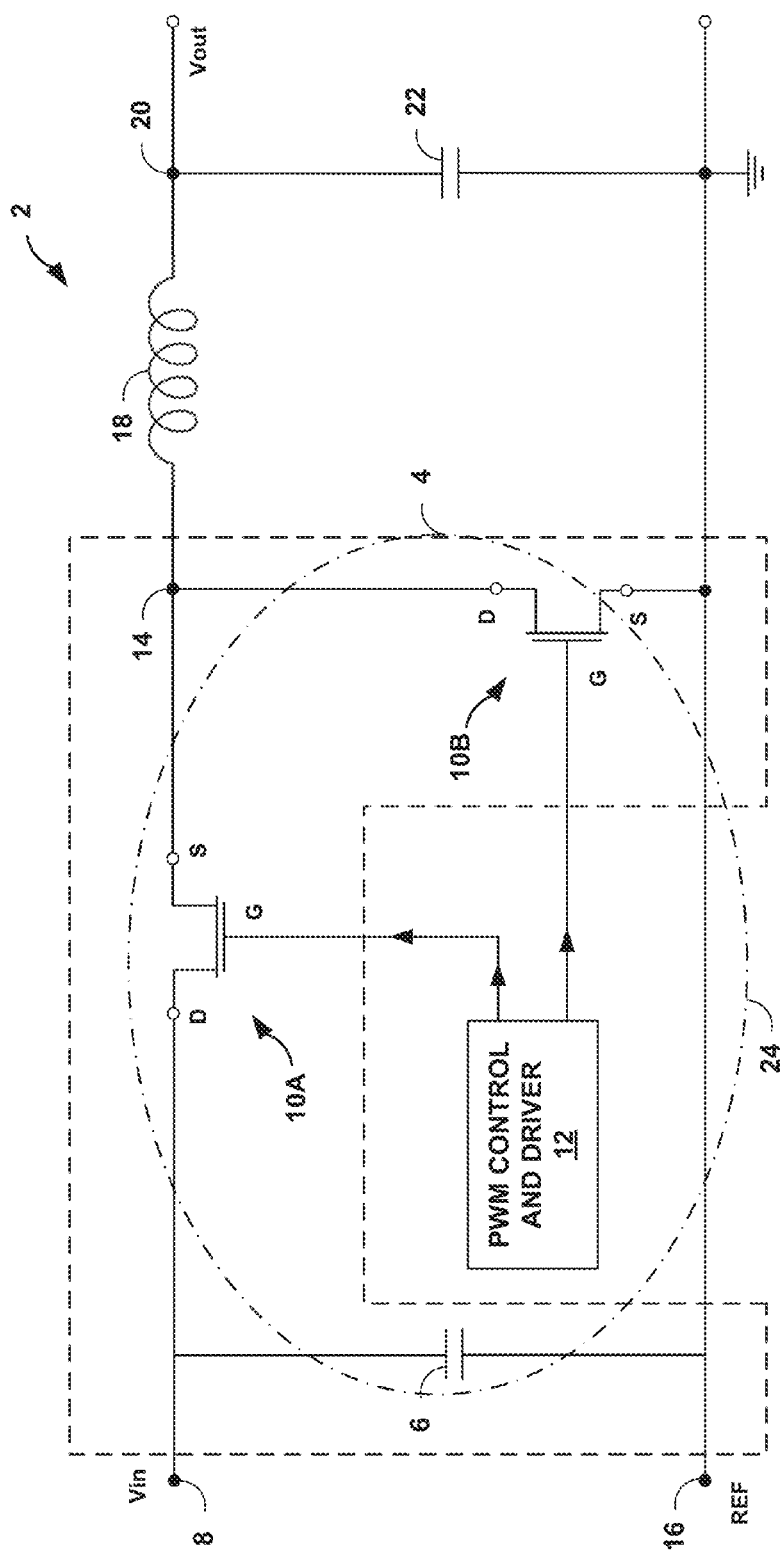
FIG. 1 is a circuit diagram of a half-bridge circuit including a capacitor between an input node and a reference node, in accordance with some examples of this disclosure.

FIG. 1 is a circuit diagram of a half-bridge circuit including a capacitor 6 between an input node 8 and a reference node 16, in accordance with some examples of this disclosure. In some examples, power converter 2 may comprise a half-bridge direct-current-to-direct-current (DC-to-DC) buck converter for converting an input DC signal to an output DC signal with a lower voltage. As a DC-to-DC buck converter, power converter 2 may operate as a voltage regulator in a variety of applications. As a DC-to-DC buck converter, a voltage amplitude of an input DC signal may be higher than a voltage amplitude of an output DC signal. However, the techniques of this disclosure may apply to other circuits and configurations, such as other power converters, including multi-phase power converters.

Power converter 2 may include device 4, which may include an integrated circuit (IC) or discrete components. Power converter 2 may include transistors 10A, 10B, inductor 18, capacitor 22, and pulse-width modulation (PWM) control and driver 12. In some examples, power converter 2 may contain more or fewer components than the components depicted in FIG. 1. Power converter 2 may include input node 8, reference node 16, and output node 20, as well as other nodes not shown in FIG. 1. Nodes 8, 16, 20 may be configured to connect to external components. For example, input node 8 may connect to an input voltage such as a power supply, output node 20 may connect to an electronic device, reference node 16 may connect to a reference voltage, such as reference ground. In some examples, PWM control and driver 12 may connect to an external circuit to a node (not shown in FIG. 1).

Although, a MOSFET symbol is shown in FIG. 1 as transistors 10A, 10B, it is contemplated that any electrical device that is controlled by a voltage may be used in place of the MOSFET as shown. For example, transistors 10A, 10B may include, but not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control.

Transistors 10A, 10B may comprise n-type transistors or p-type transistors, and transistors 10A, 10B may comprise vertical power transistors. For a vertical power transistor, the source terminal and the drain terminal may be on opposite sides or opposite surfaces of the transistor. Current in a vertical power transistor may flow through the transistor from top to bottom or from bottom to top. In some examples, transistors 10A, 10B may comprise other analog devices such as diodes. Transistors 10A, 10B may also include freewheeling diodes connected in parallel with transistors to prevent reverse breakdown of transistors 10A, 10B. In some examples, transistors 10A, 10B may operate as switches or as analog devices. In still other examples, transistors 10 may include more than two transistors, such as in multi-phase power converters or other more complex power circuits. For example, in a multi-phase power converter, power converter 2 may have one high-side transistor and one low-side transistor for each phase. Therefore, a multi-phase power converter may include one or more replications of power converter 2 as depicted in FIG. 1.

FIG. 1 depicts transistors 10A, 10B with three terminals: drain (D), source (S), and gate (G). Current may flow between the drain and source of transistors 10A, 10B, based on the voltage at the gate. Current may flow from input node 8 to switch node 14, through the drain and source of transistor 10A, based on the voltage at the gate of transistor 10A. Current may flow from switch node 14 to reference node 16, through the drain and source of transistor 10B, based on the voltage at the gate of transistor 10B. Transistor 10A may comprise a high-side transistor, and transistor 10B may comprise a low-side transistor because transistor 10B is connected to reference node 16.

Transistors 10A, 10B may comprise various material compounds, such as silicon (Si), silicon carbide (SiC), Gallium Nitride (GaN), or any other combination of one or more semiconductor materials. To take advantage of higher power density requirements in some circuits, power converters may operate at higher frequencies. Improvements in magnetics and faster switching, such as Gallium Nitride (GaN) switches, may support higher frequency converters. These higher frequency circuits may require control signals to be sent with more precise timing than for lower frequency circuits.

PWM control and driver 12 may deliver signals and/or voltages to the control terminals of transistors 10A, 10B. FIG. 1 depicts PWM control and driver 12 as one component, but the PWM control circuit and the driver circuit may be separate components. In some examples, PWM control and driver 12, only the PWM control circuit, or only the driver circuit may be located outside of power converter 2 or outside of device 4.

Inductor 18 may comprise an optional coil inductor that is outside of device 4. Inductor 18 may connect to switch node 14 and output node 20. Inductor 18 may impede the flow of alternating-current (AC) electricity, while allowing DC electricity to flow between switch node 14 and output node 20.

Capacitors 6, 22 may comprise discrete capacitors, integrated silicon capacitors, film capacitors, electrolytic capacitors, ceramic capacitors, or any other suitable type of capacitors. Capacitor 6 may be inside of device 4, and capacitor 22 may be an optional component in power converter 2 outside of device 4. A first end of capacitor 6 may electrically connect to input node 8, and a second end of capacitor 6 may electrically connect to reference node 16, and capacitor 22 may connect to output node 20 and reference node 16. Capacitors 6, 22 may impede the flow of DC electricity, while allowing AC electricity to flow between nodes. Capacitor 22 may act as a smoothing capacitor for the voltage at output node 20 to moderate fluctuations in the voltage at output node 20.

In accordance with the techniques of this disclosure, capacitor 6 may reduce the ringing in loop 24 comprising input node 8, transistors 10A, 10B, switch node 14, and reference node 16. The ringing may be based on parasitic capacitances and parasitic inductances throughout device 4, such as at switch node 14 between transistors 10A, 10B. To remove the parasitic inductances at switch node 14, capacitor 6 may be electrically connected to the drain terminal of transistor 10A and the source terminal of transistor 10B. In some examples, the effectiveness of capacitor 6 in cancelling the parasitics may be based on the distance between the drain terminal of transistor 10A through capacitor 6 to the source terminal of transistor 10B. By reducing the circumference of loop 24, capacitor 6 may reduce or eliminate the ringing at switch node 14, thereby allowing faster switching speeds and lower power consumption for device 4 and power converter 2 in some examples.

By reducing the parasitics in device 4, transistors 10A, 10B may be designed with lower breakdown voltages because the resonant voltage peaks at switching may be reduced or eliminated. With lower breakdown voltages, transistors 10A, 10B may have lower drain-to-source resistance when each transistor is closed or conducting current. The lower drain-to-source resistances may improve the performance of transistors 10A, 10B, allowing transistors 10A, 10B to conduct more current at the same voltages. The lower drain-to-source resistances may also reduce the power consumption of transistors 10A, 10B.

Figure 2:
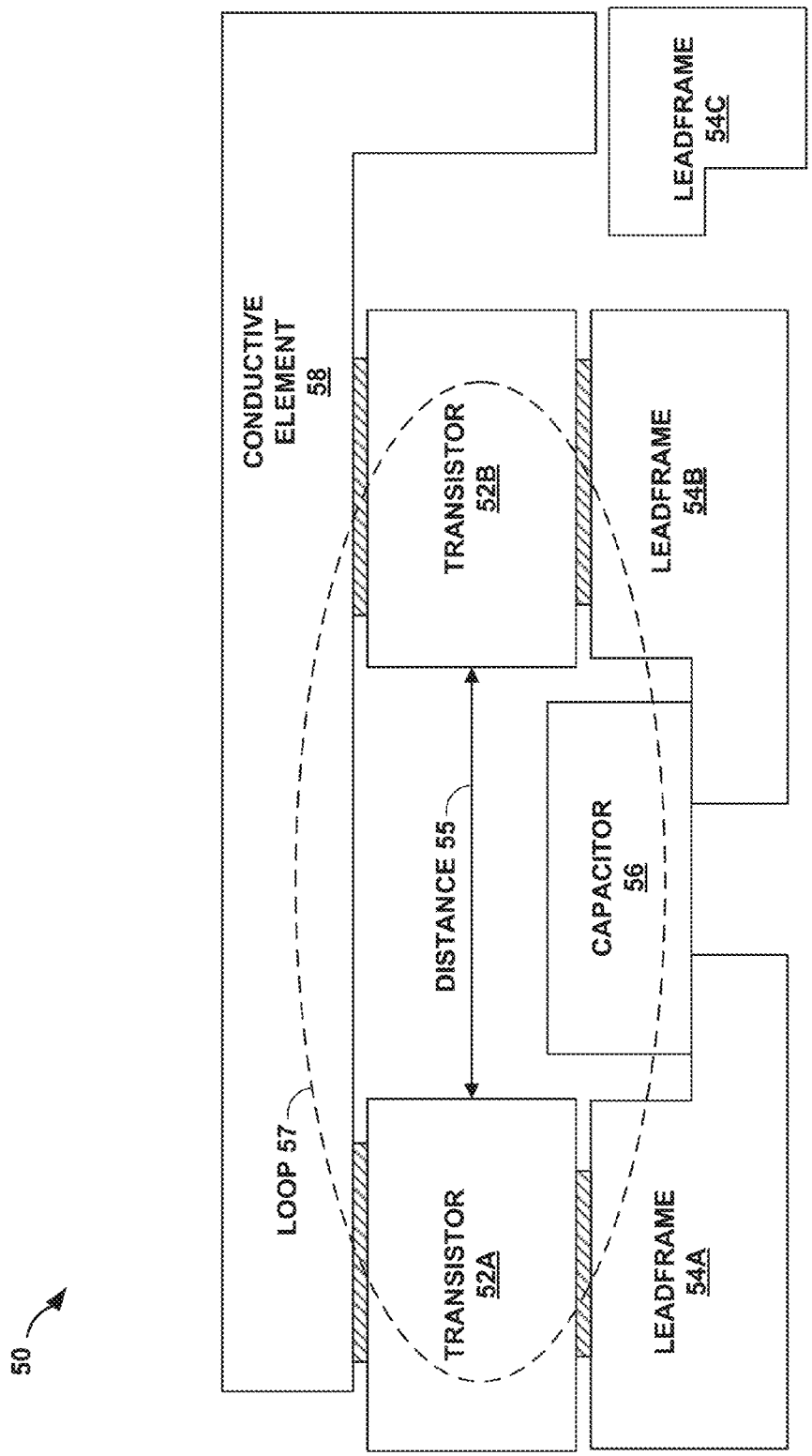
FIG. 2 is a block diagram of a device including a capacitor on a top-etched leadframe, in accordance with some examples of this disclosure.

FIG. 2 is a block diagram of a device 50 including a capacitor 56 on a top-etched leadframe 54A, 54B, in accordance with some examples of this disclosure. Device 50 may operate as a half-bridge circuit in a manner similar to device 4 depicted in FIG. 1. Transistors 52A, 52B may comprise discrete vertical transistors such as vertical power FETs. Current may travel from one side of each of transistors 52A, 52B to an opposite side of transistors 52A, 52B.

Transistors 52A, 52B may each have a control terminal and two load terminals. Each of the load terminals of transistors 52A, 52B may comprise a pad or area at the surface of transistors 52A, 52B to form external electrical connections. Transistor 52A may function as a high-side transistor in a manner similar to transistor 10A in FIG. 1, and transistor 52B may function as a low-side transistor in a manner similar to transistor 10B in FIG. 1. In some examples, transistors 52A, 52B may be MOSFETs, BJTs, IGBTs, and/or any suitable type of transistor. If transistors 52A, 52B are bipolar transistors, each control terminal may be a base and the load terminals may be emitters and collectors.

Transistors 52A, 52B may be electrically connected to conductive element 58, which may act as a switch node. Conductive element 58 may comprise a metallization layer, a clip, a ribbon, a die paddle, a wire bond, a copper pillar, a through-silicon via, and/or any other suitable conductive material. Transistor 52A may also be electrically connected to leadframe segment 54A, and transistor 52B may be electrically connected to leadframe segment 54B. Capacitor 56 may also be electrically connected to leadframe segments 54A and/or 54B. Conductive element 58 may be electrically connected to leadframe segment 54C. Leadframe segments 54A, 54B, 54C may comprise die paddles, metallization layers, and/or any other suitable conductive material. In some examples, device 50 may include embedded metal layers in addition to or instead of leadframe segments, such as in a high frequency fusion device. The embedded layers may include copper and/or any other suitable conductive material.

In some examples, the electrical connections between transistors 52A, 52B and conductive element 58 and between transistors 52A, 52B and leadframe segments 54A, 54B may be formed by soldering. The electrical connections between capacitor 56 and leadframe segments 54A, 54B may also be formed by soldering. Soldering components to form electrical connections may include placing solder between the components, applying heat to melt the solder, and allowing the solder to cool to form the electrical connection. The components of device 50 may also be glued or adhered together with conductive paste, conductive tape, conductive epoxy, and/or metal sintering. The connections between transistors 52A, 52B, leadframe segments 54A, 54B, conductive element 58 (depicted as shaded layers in FIG. 2) may include metalized plated laser vias, solder, and/or high-pressure/high-frequency metalized bonding such as diffusion bonding. Diffusion bonding may include direct bonding between transistors 52A, 52B, each of which may be a semiconductor die, and leadframe segments 54A, 54B and conductive element 58.

In some examples, device 50 may be fully or partially encapsulated in a molding compound and/or any other suitable insulating material. Transistors 52A, 52B, leadframe segments 54A, 54B, 54C, and capacitor 56 may be fully encapsulated, while conductive element 58 may be partially encapsulated to allow for thermal dissipation and/or electrical connection between conductive element 58 and an external device. In some examples, capacitor 56 may be partially encapsulated to allow external electrical connections and/or thermal dissipation. The devices depicted in any of FIGS. 2-11 may implement soldering, adhering, and/or encapsulation as described herein.

Capacitor 56 may be electrically connected to leadframe segments 54A, 54B. Capacitor 56 may comprise one or more capacitors connected in parallel to function similar to a single capacitor. A first end of each capacitor of capacitor 56 may be electrically connected to leadframe segment 54B, and a second end of each capacitor of capacitor 56 may be electrically connected to leadframe segment 54A.

Each of leadframe segments 54A, 54B may be etched, carved, and/or drilled to remove a space for capacitor 56 to be positioned on top of each of leadframe segments 54A, 54B. Leadframe segments 54A, 54B, as depicted in FIG. 2, may be referred to as "top-etched" because the etching, carving, or drilling may remove more of the top portions of leadframe segments 54A, 54B than the bottom portions of leadframe segments 54A, 54B. Leadframe segments 54A, 54B, as depicted in FIG. 2, may also be referred to as "adjacent-etched" because the top portion of leadframe segments 54A, 54B is adjacent to transistors 52A, 52B and the bottom portion of leadframe segments 54A, 54B is opposite of transistors 52A, 52B. Capacitor 56 may be positioned partially between transistors 52A, 52B, such that a portion of capacitor 56 may extend into the space between transistors 52A, 52B.

Capacitor 56 may reduce the ringing at conductive element 58 during transitions when one transistor of transistors 52A, 52B opens and the other transistor of transistors 52A, 52B closes. The effectiveness of capacitor 56 between leadframe segments 54A, 54B may be based on the circumference of loop 57 including capacitor 56, leadframe segments 54A, 54B, transistors 52A, 52B, and conductive element 58. By positioning capacitor 56 between transistors 52A, 52B, device 50 may reduce distance 55 and the circumference of loop 57. In some examples, loop 57 may include a distance from transistor 52A through leadframe segment 54A, capacitor 56, and leadframe segment 54B to transistor 52B that is less than or equal to approximately one millimeter. A distance in loop 57 may be measured by tracing an electrical path through each of the components in loop 57.

Figure 3:
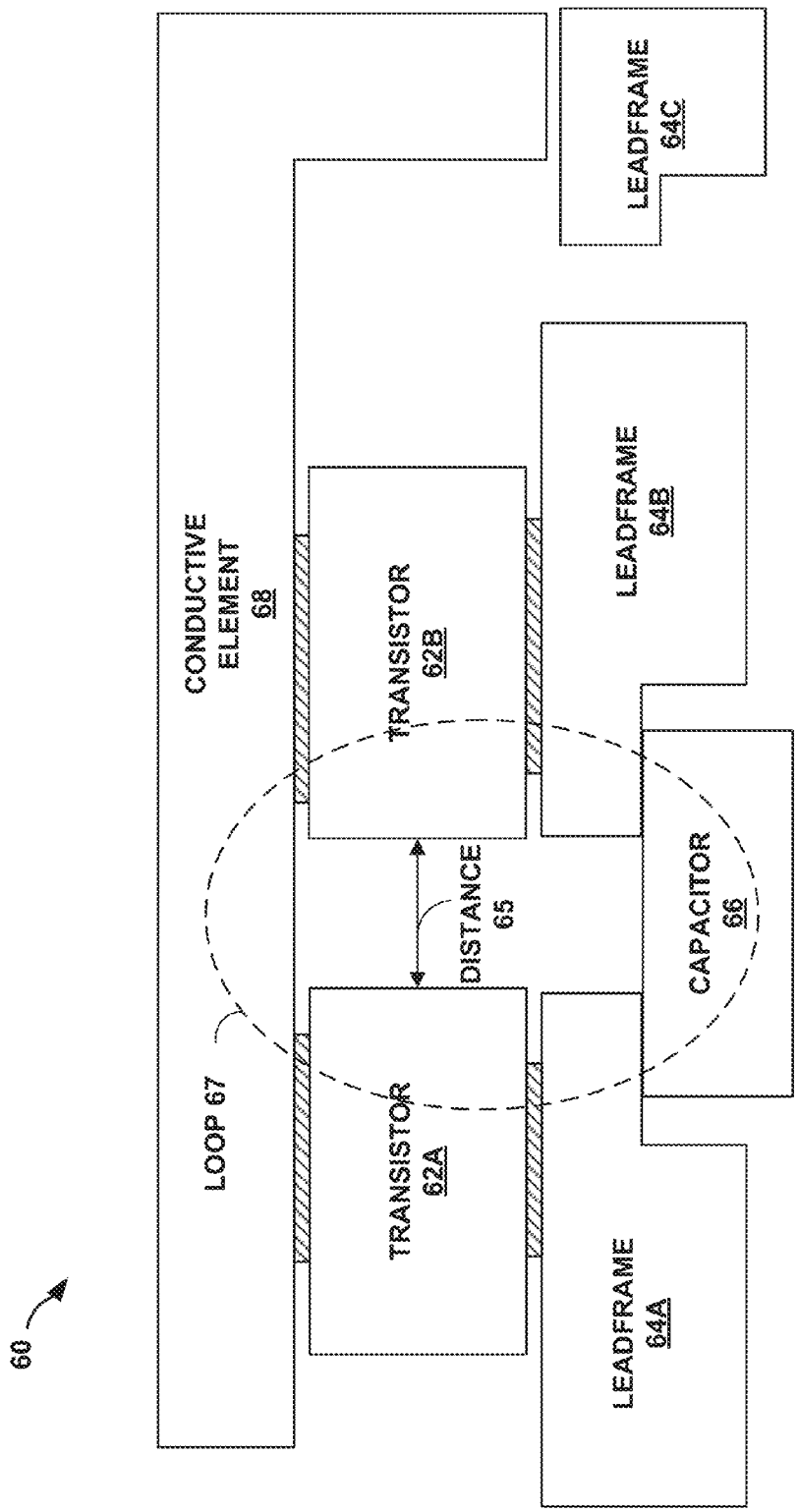
FIG. 3 is a block diagram of a device including a capacitor on a bottom-etched leadframe, in accordance with some examples of this disclosure.

FIG. 3 is a block diagram of a device 60 including a capacitor 66 on a bottom-etched leadframe 64, in accordance with some examples of this disclosure. Device 60 may operate as a half-bridge circuit in a manner similar to device 4 depicted in FIG. 1. Transistors 62A, 62B may be electrically connected to conductive element 68, which may act as a switch node. Transistor 62A may also be electrically connected to leadframe segment 64A, and transistor 62B may be electrically connected to leadframe segment 64B.

Capacitor 66 may be electrically connected to leadframe segments 64A, 64B. Each of leadframe segments 64A, 64B may be etched, carved, and/or drilled to remove a space for capacitor 66 to be positioned on the bottom of each of leadframe segments 64A, 64B. Leadframe segments 64A, 64B, as depicted in FIG. 3, may be referred to as "bottom-etched" because the etching, carving, or drilling may remove more of the bottom portions of leadframe segments 64A, 64B than the top portions of leadframe segments 64A, 64B. Leadframe segments 64A, 64B, as depicted in FIG. 3, may also be referred to as "opposite-etched" because the top portion of leadframe segments 64A, 64B is adjacent to transistors 62A, 62B and the bottom portion of leadframe segments 64A, 64B is opposite of transistors 62A, 62B. For devices including bottom-etched leadframe segments 64A, 64B and possibly other devices, soldering may include double-sided reflow to form the electrical connections for capacitor 66.

In some examples, each of leadframe segments 64A, 64B may have a thickness greater than one hundred micrometers and less than approximately three hundred micrometers. The thickness of capacitor 66 may be greater than one hundred micrometers and less than approximately two hundred micrometers. The thickness of a component may be measured in a vertical direction as depicted in FIG. 3. In some examples, a distance from transistor 62A to the end of capacitor 66 that is electrically connected to leadframe segment 64A may be less than approximately four hundred micrometers. A distance from transistor 62B to the end of capacitor 66 that is electrically connected to leadframe segment 64B may be less than approximately four hundred micrometers. In some examples, the distance may be as small as one hundred micrometers for two-hundred-micrometer half-etched leadframes. The distance from one of transistors 62A, 62B to an end of capacitor 66 may be measured by tracing an electrical path through loop 67 that may include one of leadframe segments 64A, 64B. A short distance from each of transistors 62A, 62B to the ends of capacitor 66 may reduce the effect of parasitics in loop 67. The distances described herein may apply to the devices in any of FIGS. 2-11. As used herein, "approximately" may indicate a tolerance of ten percent for distances and dimensions.

In some examples, each of leadframe segments 64A, 64B may be configured to attach to an optional printed circuit board (PCB) or an optional printed wiring board (PWB) (not shown in FIG. 3). Capacitor 66 may be configured to attach to the PCB or the PWB. Leadframe segments 64A, 64B and capacitor 66 may be electrically connected to traces in the PCB or the PWB.

Capacitor 66 may reduce the ringing at conductive element 68 during transitions when one transistor of transistors 62A, 62B opens and the other transistor of transistors 62A, 62B closes. The effectiveness of capacitor 66 between leadframe segments 64A, 64B may be based on the circumference of loop 67 including capacitor 66, leadframe segments 64A, 64B, transistors 62A, 62B, and conductive element 68. By positioning capacitor 66 between transistors 62A, 62B, device 60 may reduce distance 65 and the circumference of loop 67. In some examples, distance 65 may be shorter than distance 55 depicted in FIG. 2, and the circumference of loop 67 may be shorter than the circumference of loop 57 depicted in FIG. 3. Loop 67 may include an inductance of less than approximately three hundred nanofarads.

In some examples, loop 67 may include a distance from transistor 62A through leadframe segment 64A, capacitor 66, and leadframe segment 64B to transistor 62B that is less than or equal to approximately one millimeter. A distance in loop 67 may be measured by tracing an electrical path through each of the components in loop 67. The distances described herein may apply to the devices in any of FIGS. 2-11.

Figure 4:
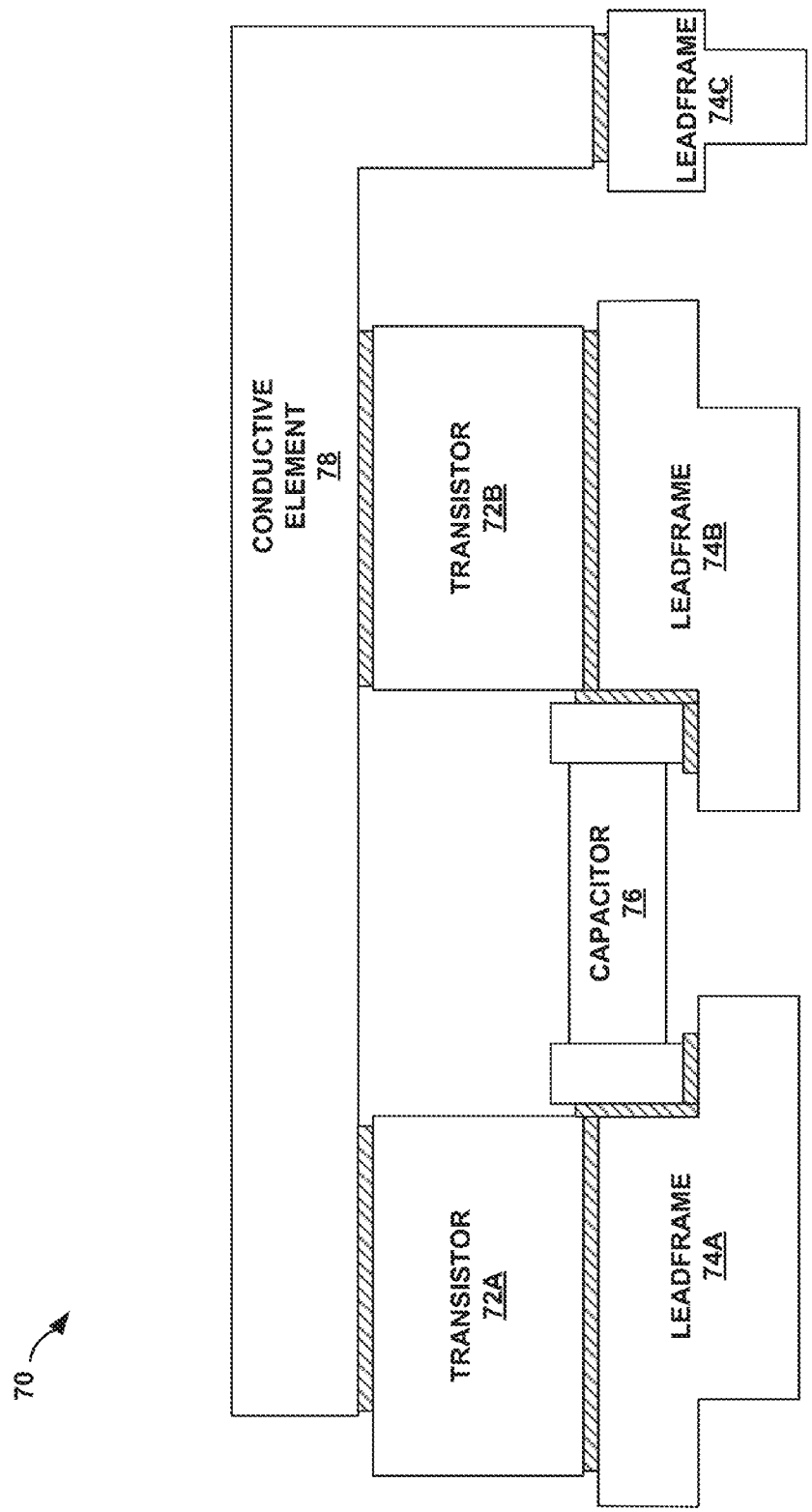
FIG. 4 is a diagram of a device including a capacitor on a top-etched leadframe, in accordance with some examples of this disclosure.

FIG. 4 is a diagram of a device 70 including a capacitor 76 on a top-etched leadframe 74, in accordance with some examples of this disclosure. Device 70 may operate as a half-bridge circuit in a manner similar to device 4 depicted in FIG. 1. Transistors 72A, 72B may be electrically connected to conductive element 78, which may act as a switch node. Transistor 72A may also be electrically connected to leadframe segment 74A, and transistor 72B may be electrically connected to leadframe segment 74B.

Capacitor 76 may be electrically connected to leadframe segments 74A, 74B. Electrically connecting an end of capacitor 76 to one of leadframe segments 74A, 74B may include etching a portion of one or both of leadframe segments 74A, 74B. Leadframe segments 74A, 74B, as depicted in FIG. 4, may be referred to as "top-etched" because the etching, carving, or drilling may remove more of the bottom portions of leadframe segments 74A, 74B than the top portions of leadframe segments 74A, 74B. Leadframe segments 74A, 74B, as depicted in FIG. 4, may also be referred to as "adjacent-etched" because the top portion of leadframe segments 74A, 74B is adjacent to transistors 72A, 72B and the bottom portion of leadframe segments 74A, 74B is opposite of transistors 72A, 72B. Capacitor 76 may be positioned partially between transistors 72A, 72B, such that a portion of capacitor 76 may extend into the space between transistors 72A, 72B.

Figure 5:
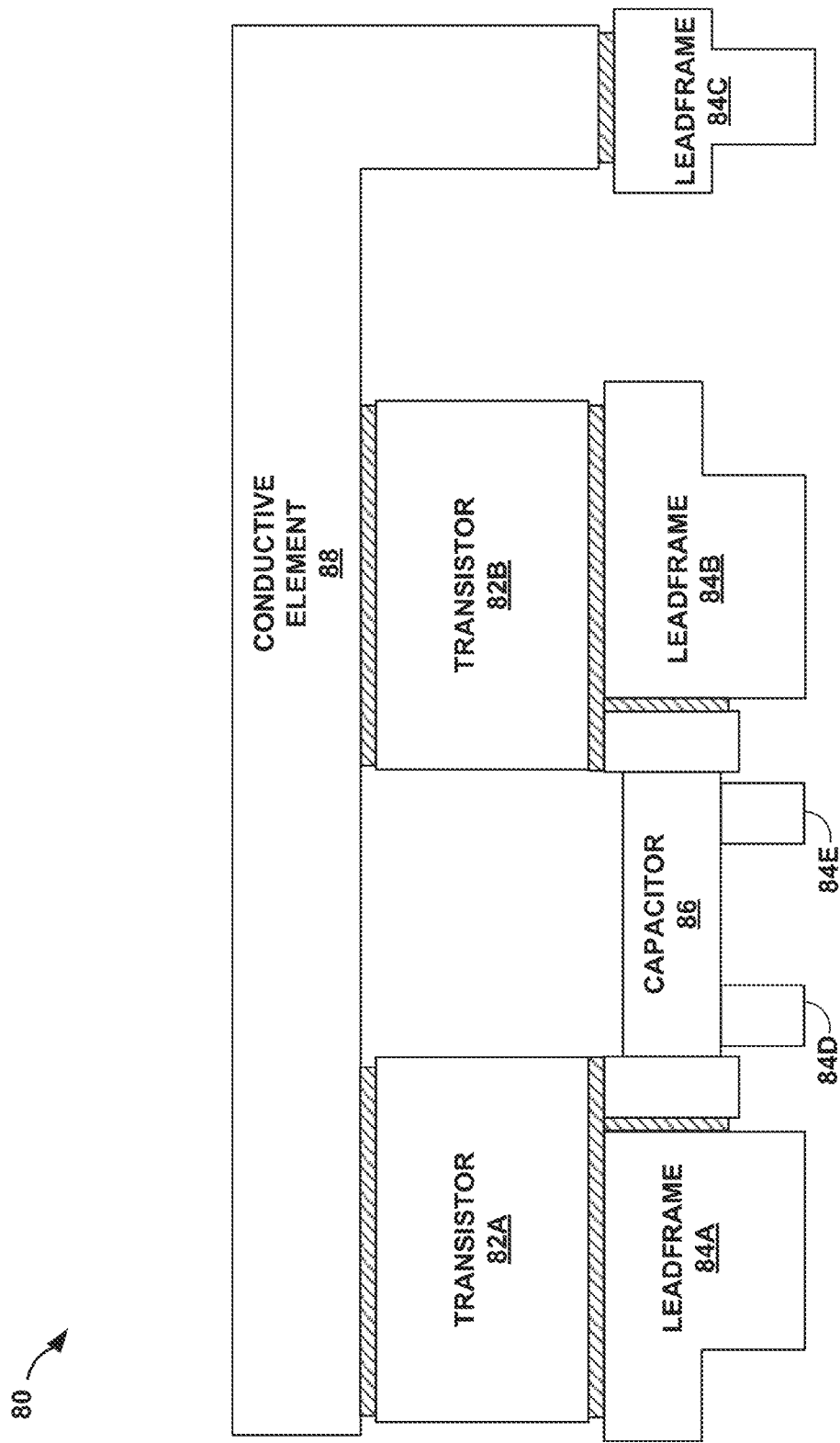
FIG. 5 is a diagram of a device including a capacitor on a leadframe, in accordance with some examples of this disclosure.

FIG. 5 is a diagram of a device 80 including a capacitor 86 on a leadframe 84, in accordance with some examples of this disclosure. Device 80 may operate as a half-bridge circuit in a manner similar to device 4 depicted in FIG. 1. Transistors 82A, 82B may be electrically connected to conductive element 88, which may act as a switch node. Transistor 82A may also be electrically connected to leadframe segment 84A, and transistor 82B may be electrically connected to leadframe segment 84B. Capacitor 86 may be electrically connected to leadframe segments 84A, 84B, 84D, 84E. Leadframe segments 84A, 84B, as depicted in FIG. 5, may be referred to as "top-etched" and/or "bottom-etched" because the etching, carving, or drilling may remove bottom portions and top portions of leadframe segments 84A, 84B. As depicted in FIG. 5, a distance between one of transistors 82A, 82B and an end of capacitor 86 may include an electrical path that does not necessarily include one of leadframe segments 84A, 84B.

Figure 6:
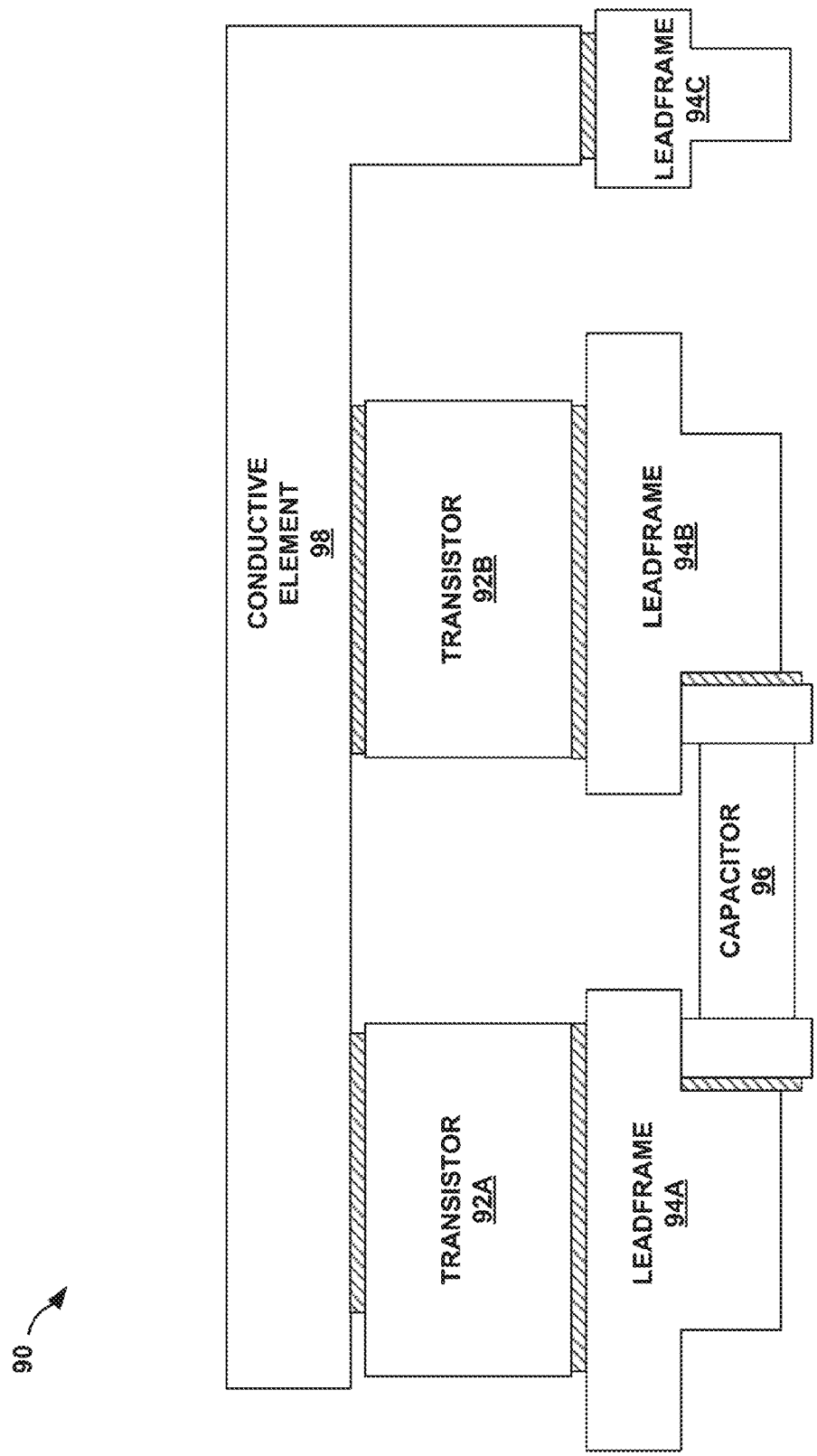
FIG. 6 is a diagram of a device including a capacitor on a bottom-etched leadframe, in accordance with some examples of this disclosure.

FIG. 6 is a diagram of a device including a capacitor 96 on a bottom-etched leadframe 94, in accordance with some examples of this disclosure. Device 90 may operate as a half-bridge circuit in a manner similar to device 4 depicted in FIG. 1. Transistors 92A, 92B may be electrically connected to conductive element 98, which may act as a switch node. Transistor 92A may also be electrically connected to leadframe segment 94A, and transistor 92B may be electrically connected to leadframe segment 94B. Capacitor 96 may be electrically connected to transistors 92A, 92B and leadframe segments 94A, 94B. Leadframe segments 94A, 94B, as depicted in FIG. 6, may be referred to as "bottom-etched" because the etching, carving, or drilling may remove more of the bottom portions of leadframe segments 94A, 94B than the top portions of leadframe segments 94A, 94B. Leadframe segments 94A, 94B, as depicted in FIG. 6, may also be referred to as "opposite-etched."

Figure 7:
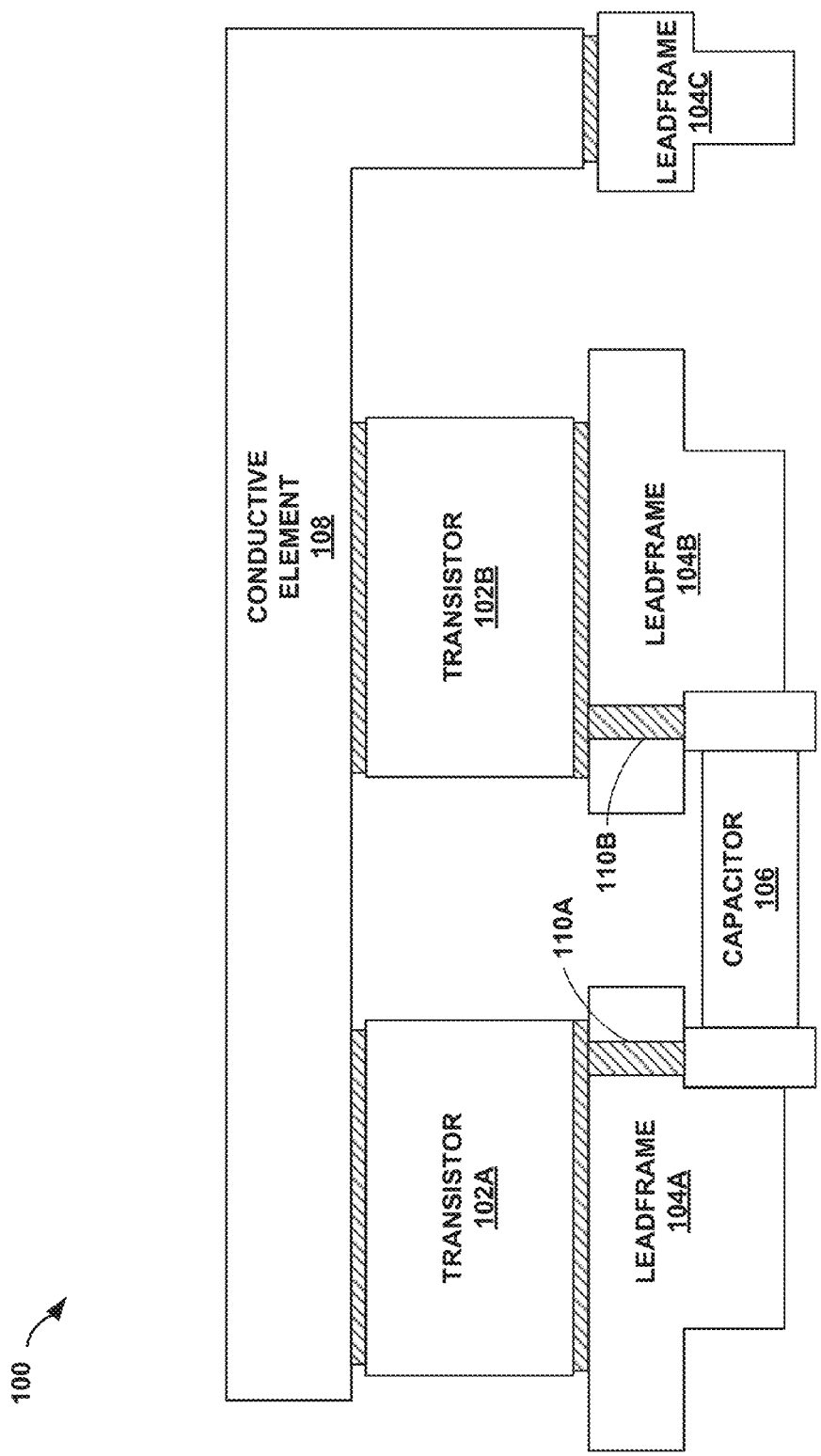
FIG. 7 is a diagram of a device including a capacitor on a bottom-etched leadframe, in accordance with some examples of this disclosure.

FIG. 7 is a diagram of a device including a capacitor 106 on a bottom-etched leadframe 104, in accordance with some examples of this disclosure. Device 100 may operate as a half-bridge circuit in a manner similar to device 4 depicted in FIG. 1. Transistors 102A, 102B may be electrically connected to conductive element 108, which may act as a switch node. Transistor 102A may also be electrically connected to leadframe segment 104A, and transistor 102B may be electrically connected to leadframe segment 104B. Capacitor 106 may be electrically connected to leadframe segments 104A, 104B. Leadframe segments 104A, 104B, as depicted in FIG. 7, may be referred to as "bottom-etched" because the etching, carving, or drilling may remove more of the bottom portions of leadframe segments 104A, 104B than the top portions of leadframe segments 104A, 104B. Leadframe segments 104A, 104B, as depicted in FIG. 7, may also be referred to as "opposite-etched."

Capacitor 106 may be electrically connected to transistors 102A, 102B through conductive paths 11A, 110B. In some examples, conductive paths 110A, 110B may be pre-formed through leadframe segments 104A, 104B by first creating a hole in each of leadframe segments 104A, 104B and then placing or forming conductive paths 110A, 110B in the respective holes of leadframe segments 104A, 104B. Conductive paths 110A, 110B may be formed through leadframe segments 104A, 104B by drilling, etching, or carving a hole or path through leadframe segments 104A, 104B and filling the hole or path with conductive material, such as copper or solder. Conductive paths 110A, 110B may comprise the same conductive materials as the respective source terminal or drain terminal of transistors 102A, 102B and/or any other suitable conductive material. By using the same conductive material as the respective terminals of transistors 102A, 102B, the connection between conductive paths 110A, 110B and transistors 102A, 102B and capacitor 106 may not need soldering.

Figure 8:
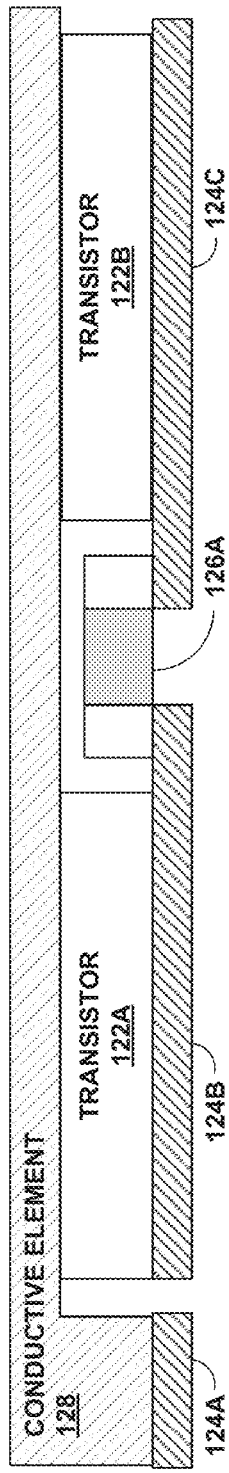
FIG. 8 is a side-view diagram of a device including a discrete capacitor on a leadframe, in accordance with some examples of this disclosure.

FIG. 8 is a side-view diagram of a device 120 including a discrete capacitor 126A on a leadframe 128, in accordance with some examples of this disclosure. Device 120 may operate as a half-bridge circuit in a manner similar to device 4 depicted in FIG. 1. Transistors 122A, 122B may be electrically connected to conductive element 128, which may act as a switch node. Transistor 122A may also be electrically connected to leadframe segment 124A, and transistor 122B may be electrically connected to leadframe segment 124B. Capacitor 126A may be electrically connected to leadframe segments 124A, 124B.

Figure 9:
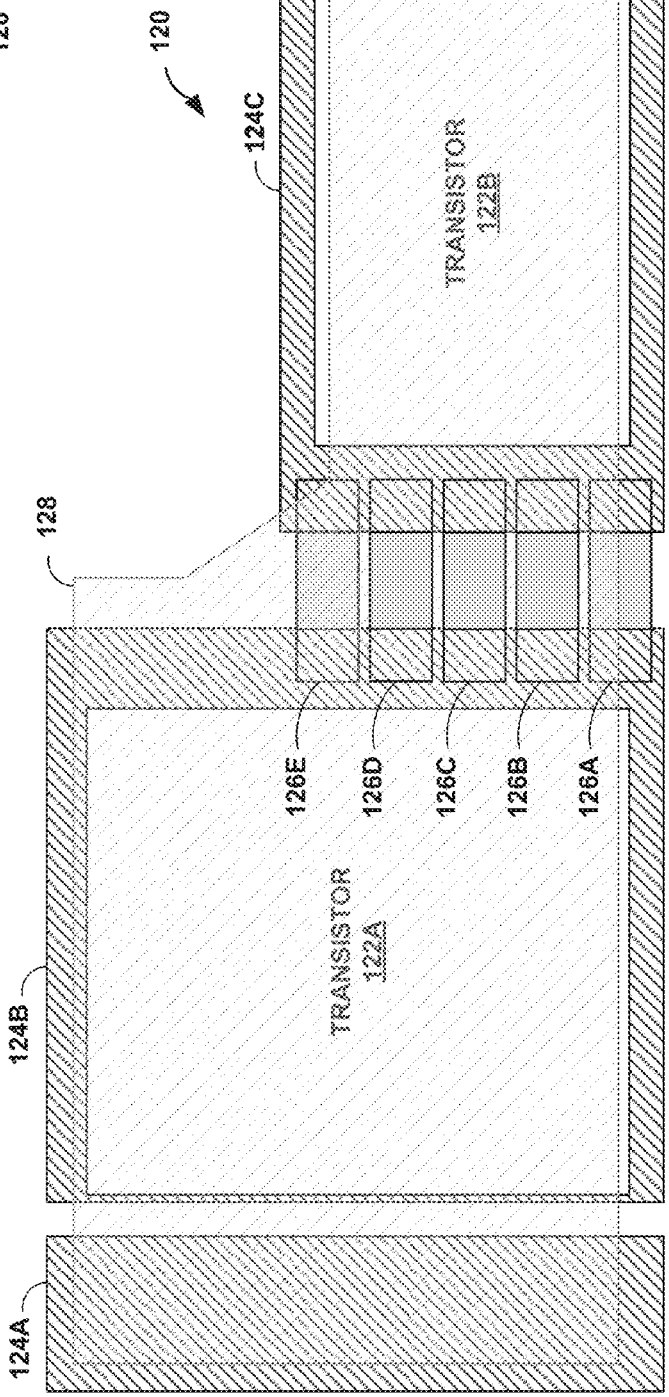
FIG. 9 is a top-view diagram of a device including discrete capacitors on a leadframe, in accordance with some examples of this disclosure.

FIG. 9 is a top-view diagram of a device 120 including discrete capacitors 126A-126E on a leadframe 128, in accordance with some examples of this disclosure. Device 120 may operate as a half-bridge circuit in a manner similar to device 4 depicted in FIG. 1. Capacitors 126A-126E may operate in parallel in a similar manner to a single capacitor. Positioning capacitors 126A-126E in parallel may increase the effective width and capacitance of an equivalent capacitor.

Figure 10:
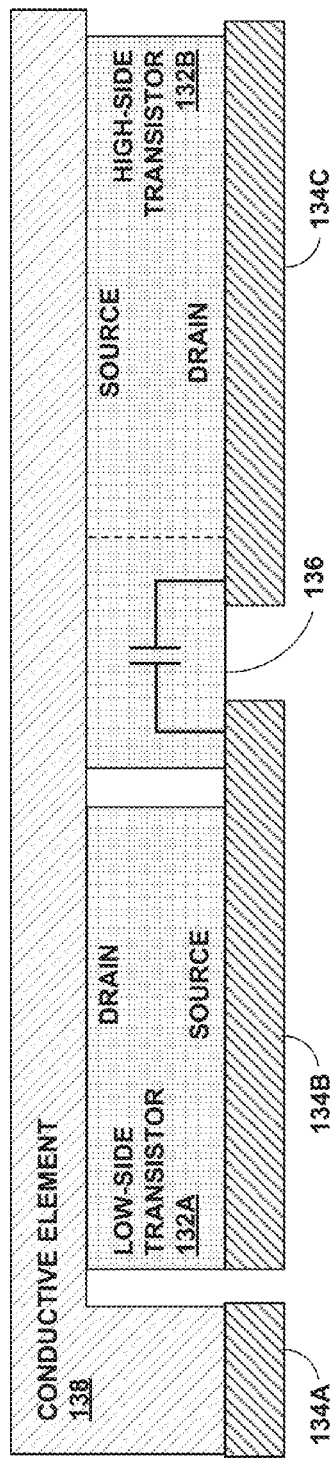
FIG. 10 is a block diagram of a device including an integrated capacitor, in accordance with some examples of this disclosure.

FIG. 10 is a block diagram of a device 130 including an integrated capacitor 136, in accordance with some examples of this disclosure. Device 130 may operate as a half-bridge circuit in a manner similar to device 4 depicted in FIG. 1. Transistors 132A, 132B may be electrically connected to conductive element 138, which may act as a switch node. Transistor 132A may also be electrically connected to leadframe segment 134A, and transistor 132B may be electrically connected to leadframe segment 134B. Integrated capacitor 136 may be electrically connected to leadframe segments 134A, 134B. Transistor 132B and integrated capacitor 136 may comprise a single piece of semiconductor material, such as silicon, and be referred to as an IC. In some examples, integrated capacitor 136 may provide benefits such as smaller space, fewer components, and reduced parasitics.

Figure 11:
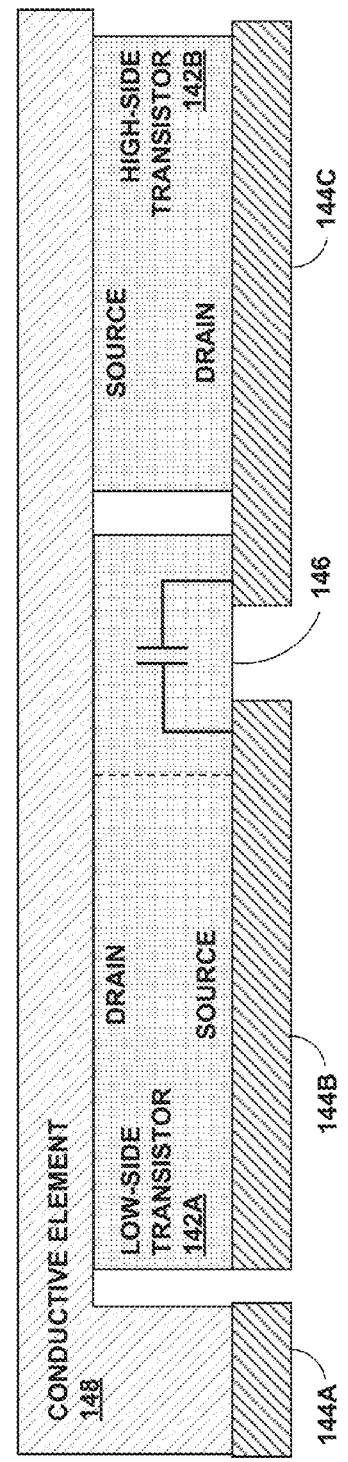
FIG. 11 is a block diagram of a device including an integrated capacitor, in accordance with some examples of this disclosure.

FIG. 11 is a block diagram of a device 140 including an integrated capacitor 146, in accordance with some examples of this disclosure. Device 140 may operate as a half-bridge circuit in a manner similar to device 4 depicted in FIG. 1. Transistors 142A, 142B may be electrically connected to conductive element 148, which may act as a switch node. Transistor 142A may also be electrically connected to leadframe segment 144A, and transistor 142B may be electrically connected to leadframe segment 144B. Integrated capacitor 146 may be electrically connected to leadframe segments 144A, 144B. Transistor 142A and integrated capacitor 146 may comprise a single piece of semiconductor material, such as silicon, and be referred to as an IC. In some examples, integrated capacitor 146 may provide benefits such as smaller space, fewer components, and reduced parasitics. Integrated capacitor 146 may operate in a different manner than integrated capacitor 136 based on whether the capacitor is integrated with a source-down transistor or a drain-down transistor. In some examples, integrated capacitor 146 may reduce the parasitics in device 140 more effectively than integrated capacitor 136 may reduce the parasitics in device 130 because integrated capacitor 146 is integrated with source-down transistor 142A.

For the devices in any of FIGS. 2-11, the transistor dies may include a thickness of approximately sixty micrometers. In some examples, the transistor dies may be thicker or thinner, depending on the application. The capacitor may include a height or thickness of approximately one hundred micrometers or one hundred and fifty micrometers and a length of approximately three hundred micrometers. Each leadframe segment may include a thickness of approximately two hundred micrometers or two hundred and fifty micrometers. A thicker leadframe segment may allow more etching to form a position for the capacitor, but thicker leadframe segments may be more expensive. For example, half-etching may remove one hundred micrometers or one hundred and fifty micrometers of thickness from the leadframe segment. The dimensions described herein may be exemplary and are not intended to limit this disclosure to any particular application or applications.

For the devices in any of FIGS. 2-11, the transistors may include control terminals, such as gate terminals. FIGS. 2-11 may have not depicted the control terminals for the transistors, but the control terminals may be electrical connected to internal devices or external devices. The control terminals may be electrically connected to one or more driver circuits that produce signals to control the operation of the transistors. The one or more driver circuits may be positioned in or outside of the devices of FIGS. 2-11.

Figure 12:
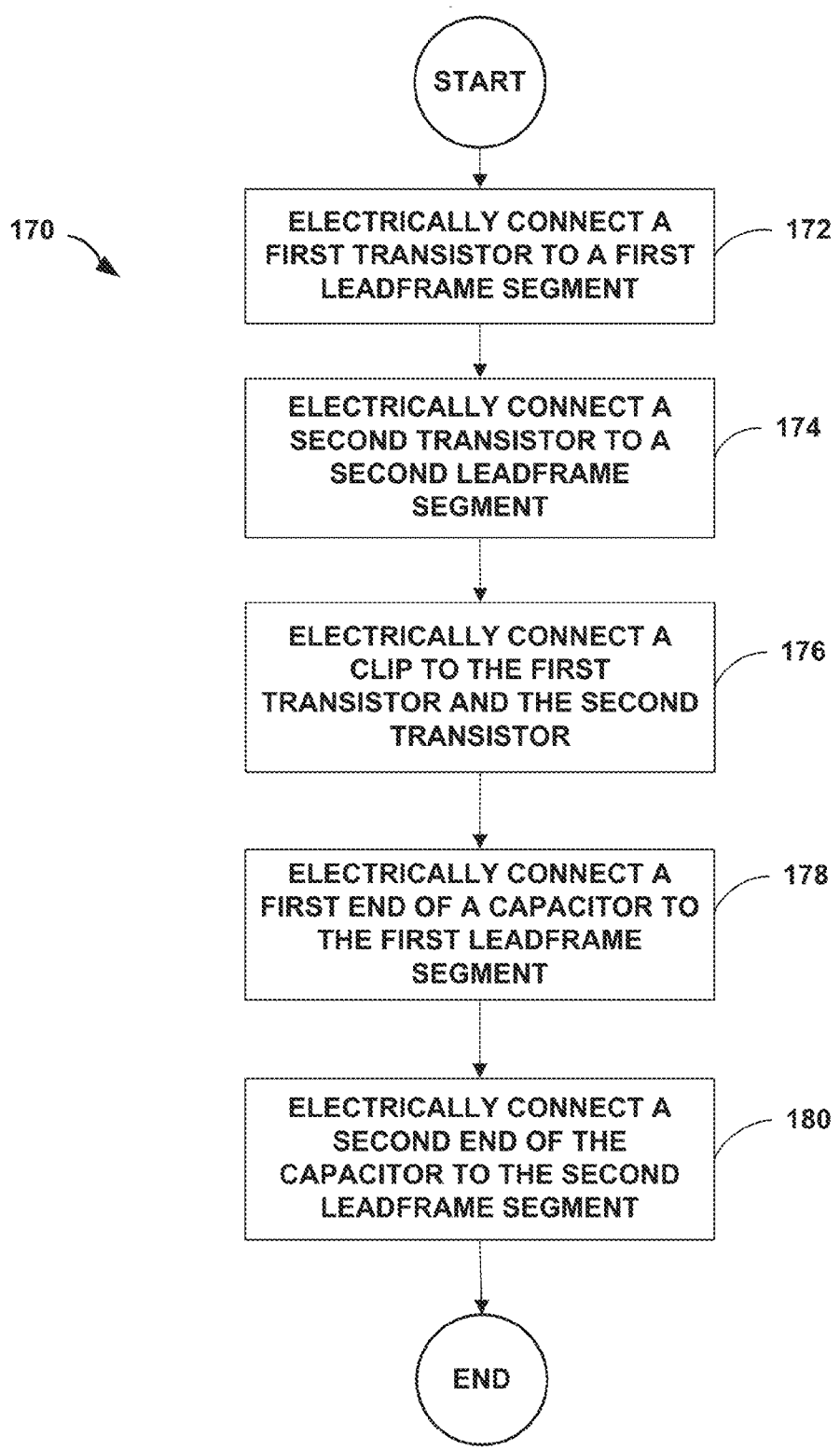
FIG. 12 is a flowchart depicting a process of constructing a circuit, in accordance with some examples of this disclosure.

FIG. 12 is a flowchart depicting a process 170 of constructing a circuit, in accordance with some examples of this disclosure. Process 170 is described with reference to device 50 in FIG. 2, although other components, such as devices 60, 70, 80, 90, 100, 120, 130, and 140 in FIGS. 2-11, may exemplify similar techniques.

Process 170 includes electrically connecting first transistor 52A to first leadframe segment 54A (172). First transistor 52A may comprise a high-side vertical power FET with a high-side source terminal facing up and a high-side drain terminal facing down. The drain terminal of first transistor 52A may electrically connect to first leadframe segment 54A. First leadframe segment 54A may comprise an input-voltage node.

Process 170 further includes electrically connecting second transistor 52B to first leadframe segment 54B (174). Second transistor 52B may comprise a low-side vertical power FET with a low-side source terminal facing down and a low-side drain terminal facing up. The source terminal of second transistor 52B may electrically connect to second leadframe segment 54B. Second leadframe segment 54B may comprise a reference-voltage node.

Process 170 further includes electrically connecting conductive element 58 to first transistor 52A and second transistor 52B (176). The high-side source terminal of first transistor 52A may electrically connect to conductive element 58. The low-side drain terminal of first transistor 52A may electrically connect to conductive element 58. In some examples, conductive element 58 may act as a switch node in a half-bridge circuit configuration.

Process 170 further includes electrically connecting a first end of capacitor 56 to first leadframe segment 54A (178). The first end of capacitor 56 may comprise a high side of capacitor 56 that is electrically connected to an input-voltage node. First leadframe segment 54A may be top-etched if etching, carving, or drilling removes more of the top portion of first leadframe segment 54A than the top portion of first leadframe segment 54A.

Process 170 further includes electrically connecting a second end of capacitor 56 to second leadframe segment 54B (180). The second end of capacitor 56 may comprise a low side of capacitor 56 that is electrically connected to a reference-voltage node. Second leadframe segment 54B may be top-etched if etching, carving, or drilling removes more of the top portion of second leadframe segment 54B than the top portion of second leadframe segment 54B.

Loop 57 may comprise capacitor 56, leadframe segments 54A, 54B, transistors 52A, 52B, and conductive element 58. The parasitics of loop 57 may be based at least in part on the length of the circumference of loop 57. Shortening the circumference of loop 57 may reduce the effect of parasitics on the operation of device 50. In some examples, a distance between the high-side drain terminal of transistor 52A and the high side of capacitor 56 may be less than approximately four hundred micrometers. In some examples, a distance between the low-side source terminal of transistor 52B and the low side of capacitor 56 may be less than approximately four hundred micrometers.

With reduced parasitics in device 4, transistors 10A, 10B may be designed with lower breakdown voltages. Transistors 10A, 10B may have lower drain-to-source resistance when each transistor is on due to the lower breakdown voltages. The lower drain-to-source resistances may improve the performance of transistors 10A, 10B, allowing transistors 10A, 10B to conduct more current at the same voltages. The lower drain-to-source resistances may also reduce the power consumption of transistors 10A, 10B.

Figure 13:
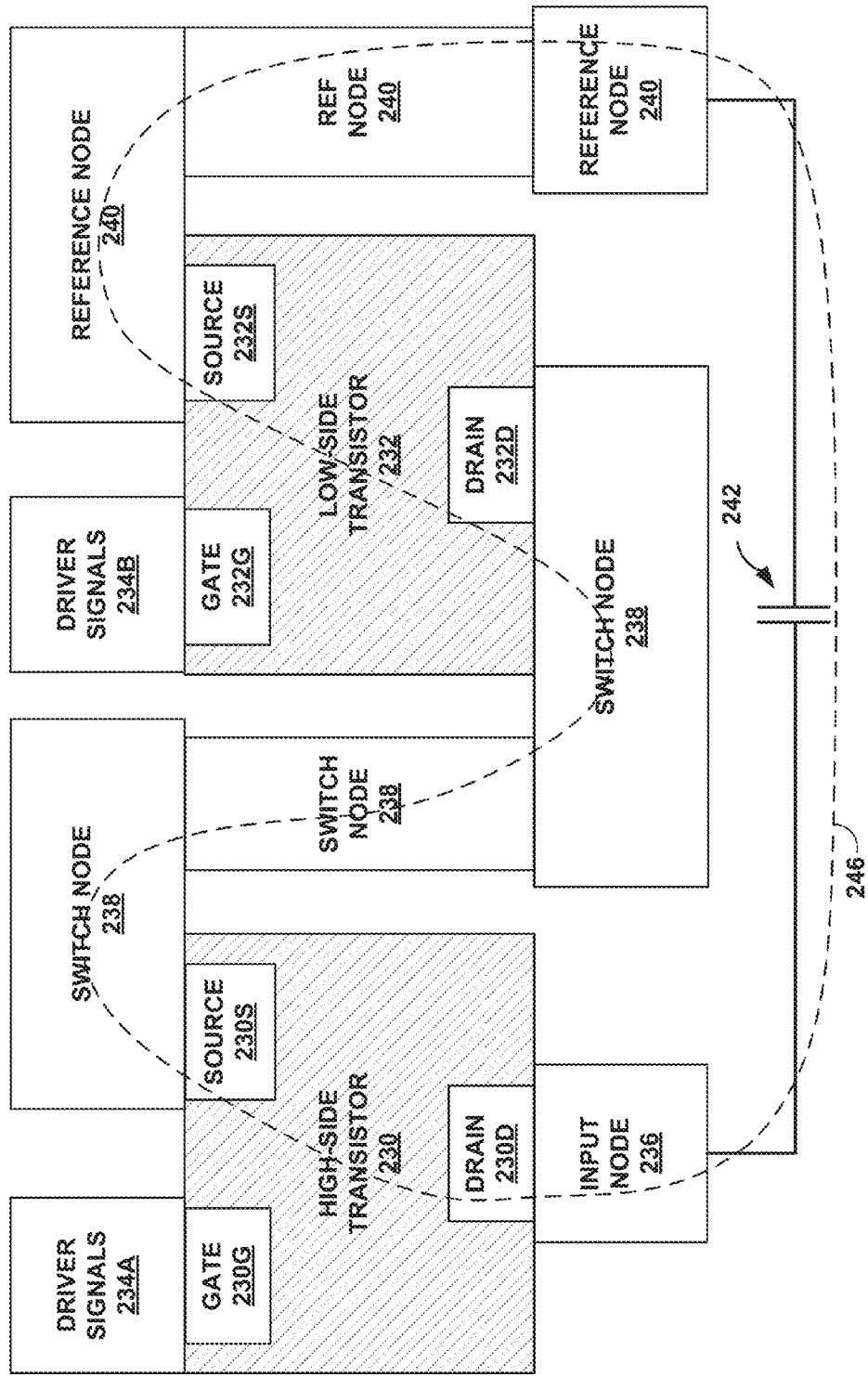
FIG. 13 is a conceptual block diagram of device circuit including two drain-down transistors, in accordance with some examples of this disclosure.

FIG. 13 is a conceptual block diagram of other device 244 including two drain-down transistors 230, 232, in accordance with some examples of this disclosure. Transistors 230, 232 may each have a control terminal, such as gate terminals 230G, 232G, which may be connected to driver signals 234A, 234B from a driver circuit (not shown in FIG. 2). Each of transistors 230, 232 may comprise two load terminals, such as source terminals 230S, 232S and drain terminals 230D, 232D. High-side transistor 230 may function in a manner similar to transistor 10A in FIG. 1, and low-side transistor 232 may function in a manner similar to transistor 10B in FIG. 1. In some examples, transistors 230, 232 may be MOSFETs, BJTs, IGBTs, and/or any suitable type of transistor. Transistors 230, 232 may be configured such that source terminal 230S is electrically connected to drain terminal 232D by switch node 238.

Capacitor 242 may reduce the ringing at switch node 238 during transitions when one transistor of transistors 230, 232 opens and the other transistor closes. The effectiveness of capacitor 242 between input node 236 and reference node 240 may be based on the circumference of loop 246 including capacitor 242, input node 236, high-side transistor 230, switch node 238, low-side transistor 232, and reference node 240. By implementing two drain-down transistors 230, 232, loop 246 may have a longer circumference and may experience more ringing than the loops in the devices depicted in FIGS. 2-11. Therefore, capacitor 242 and device 244 may be less effective at reducing the ringing at switch node 238 than the devices depicted in FIGS. 2-11.

The following numbered examples demonstrate one or more aspects of the disclosure.

Example 1

A device comprises a first leadframe segment, a second leadframe segment, and a first transistor, wherein the first transistor is electrically connected to the first leadframe segment. The device further comprises a second transistor, wherein the second transistor is electrically connected to the second leadframe segment. The device further comprises a conductive element, wherein the conductive element is electrically connected to the first transistor and the second transistor. The device further comprises a capacitor, wherein a first end of the capacitor is electrically connected to the first leadframe segment and a second end of the capacitor is electrically connected to the second leadframe segment.

Example 2

The device of example 1, further comprising an integrated circuit comprising the capacitor and the first transistor, wherein a drain terminal of the first transistor is electrically connected to the first leadframe segment. A source terminal of the first transistor is electrically connected to the conductive element, a drain terminal of the second transistor is electrically connected to the conductive element, a source terminal of the second transistor is electrically connected to the second leadframe segment, the conductive element comprises a clip or a wire.

Example 3

The device of any combination of examples 1-2, wherein the capacitor comprises at least one discrete capacitor, a first end of each capacitor of the at least one discrete capacitor is electrically connected to the first leadframe segment, and a second end of each capacitor of the at least one discrete capacitor is electrically connected to the second leadframe segment.

Example 4

The device of any combination of examples 1-3, wherein the first leadframe segment is configured to attach to a PCB, the second leadframe segment is configured to attach to the PCB, and the capacitor is configured to attach to the PCB.

Example 5

The device of any combination of examples 1-4, wherein a distance from the first transistor to the second transistor through the first leadframe segment, the capacitor, and the second leadframe segment is less than or equal to approximately one millimeter.

Example 6

The device of any combination of examples 1-5, further comprising an electrical loop comprising the first transistor, the first leadframe segment, the capacitor, and the second leadframe segment, the second transistor, and the conductive element, wherein an inductance of the electrical loop is less than approximately three hundred nanofarads.

Example 7

The device of any combination of examples 1-6, wherein a thickness of the first leadframe segment is greater than one hundred micrometers and less than approximately three hundred micrometers, a thickness of the second leadframe segment is greater than one hundred micrometers and less than approximately three hundred micrometers, and a thickness of the capacitor is greater than one hundred micrometers and less than approximately two hundred micrometers.

Example 8

The device of any combination of examples 1-7, wherein a distance from the first transistor to the first end of the capacitor is less than approximately four hundred micrometers, and a distance from the second transistor to the second end of the capacitor is less than approximately four hundred micrometers.

Example 9

A method comprises electrically connecting a first transistor to a first leadframe segment, and electrically connecting a second transistor to a second leadframe segment. The method further comprises electrically connecting a conductive element to the first transistor and the second transistor. The method further comprises electrically connecting a first end of a capacitor to the first leadframe segment, and electrically connecting a second end of the capacitor to the second leadframe segment.

Example 10

The method of example 9, wherein electrically connecting the first end of the capacitor to the first leadframe segment comprises etching a portion of the first leadframe segment adjacent to the first transistor; and electrically connecting the second end of the capacitor to the second leadframe segment comprises etching a portion of the second leadframe segment adjacent to the second transistor.

Example 11

The method of any combination of examples 9 and 10, electrically connecting the first end of the capacitor to the first leadframe segment comprises etching a portion of the first leadframe segment opposite the first transistor; and electrically connecting the second end of the capacitor to the second leadframe segment comprises etching a portion of the second leadframe segment opposite the second transistor.

Example 12

The method of any combination of examples 9-11, forming a first conductive path through the first leadframe segment; and forming a second conductive path through the second leadframe segment, wherein electrically connecting the first end of the capacitor to the first leadframe segment further comprises electrically connecting the first end of the capacitor to the first conductive path, and electrically connecting the second end of the capacitor to the second leadframe segment further comprises electrically connecting the second end of the capacitor to the second conductive path.

Example 13

The method of any combination of examples 9-12, wherein the first conductive path comprises solder, and the second conductive path comprises solder.

Example 14

The method of any combination of examples 9-13, encapsulating the first transistor, the second transistor, the first leadframe segment, the second leadframe segment, and the conductive element in a molding compound, and partially encapsulating the capacitor in the molding compound.

Example 15

The method of any combination of examples 9-14, further comprising attaching the first leadframe segment to a printed circuit board (PCB), and attaching the second leadframe segment to the PCB; and attaching the capacitor to the PCB.

Example 16

The method of any combination of examples 9-15, wherein electrically connecting the first transistor to the first leadframe segment comprises soldering the first transistor to the first leadframe segment, and electrically connecting the second transistor to the second leadframe segment comprises soldering the second transistor to the second leadframe segment. Electrically connecting the conductive element to the first transistor and the second transistor comprises soldering the conductive element to the first transistor and the second transistor, and electrically connecting the first end of the capacitor to the first leadframe segment comprises soldering the first end of the capacitor to the first leadframe segment. Electrically connecting a second end of the capacitor to the second leadframe segment comprises soldering the second end of the capacitor to the second leadframe segment.

Example 17

The method of any combination of examples 9-16, wherein a first distance between the first transistor and the first end of the capacitor is less than approximately four hundred micrometers; and a second distance between the second transistor and the second end of the capacitor is less than approximately four hundred micrometers.

Example 18

The method of any combination of examples 9-17, wherein a distance from the first transistor through the first leadframe segment, the capacitor, and the second leadframe segment to the second transistor is less than or equal to approximately one millimeter.

Example 19

A power converter device comprising an input-voltage leadframe segment, a reference-voltage leadframe segment, and a high-side transistor, wherein a high-side drain terminal of the high-side transistor is electrically connected to the input-voltage leadframe segment. The power converter device further comprises a low-side transistor, wherein a low-side source terminal of the low-side transistor is electrically connected to the reference-voltage leadframe segment. The power converter device further comprises a conductive element, wherein the conductive element is electrically connected to a high-side source terminal of the high-side transistor and a low-side drain terminal of the low-side transistor. The power converter device further comprises a capacitor, wherein a high side of the capacitor is electrically connected to the input-voltage leadframe segment, a low side of the capacitor is electrically connected to the reference-voltage leadframe segment, a first distance between the high-side drain terminal and the high side of the capacitor is less than approximately four hundred micrometers, and. The power converter device further comprises a second distance between the low-side source terminal and the low side of the capacitor is less than approximately four hundred micrometers.

Example 20

The power converter device of example 19, further comprising an integrated circuit comprising the capacitor and the low-side transistor, wherein a third distance between the high-side transistor and the integrated circuit is less than two hundred micrometers.

Various examples of the disclosure have been described. Any combination of the described systems, operations, or functions is contemplated. These and other examples are within the scope of the following claims.

What is claimed is:

1. A device comprising:
   a first transistor;
   a second transistor;
   a first leadframe segment positioned on a first side of the first transistor and electrically connected to the first transistor;
   a second leadframe segment positioned on a first side of the second transistor and electrically connected to the second transistor, wherein the first side of the first transistor and the first side of the second transistor are a same side;
   a conductive element positioned on a second side of the first transistor and positioned on a second side of the second transistor, wherein the second side of the first transistor and the second side of the second transistor are a same side, and wherein the conductive element is electrically connected to the first transistor and the second transistor; and
   a capacitor, wherein:
     a first end of the capacitor is electrically connected to the first leadframe segment, and
     a second end of the capacitor is electrically connected to the second leadframe segment.

2. The device of claim 1, further comprising an integrated circuit comprising the capacitor and the first transistor, wherein:
   a drain terminal on the first side of the first transistor is electrically connected to the first leadframe segment;
   a source terminal on the second side of the first transistor is electrically connected to the conductive element;
   a drain terminal on the second side of the second transistor is electrically connected to the conductive element;
   a source terminal on the first side of the second transistor is electrically connected to the second leadframe segment; and
   the conductive element comprises a clip or a wire.

3. The device of claim 1, wherein:
   the capacitor comprises at least one discrete capacitor;
   a first end of each capacitor of the at least one discrete capacitor is electrically connected to the first leadframe segment; and
   a second end of each capacitor of the at least one discrete capacitor is electrically connected to the second leadframe segment.

4. The device of claim 3, wherein:
   the first leadframe segment is configured to attach to a printed circuit board (PCB);
   the second leadframe segment is configured to attach to the PCB; and
   the capacitor is configured to attach to the PCB.

5. The device of claim 1, wherein a distance from the first transistor to the second transistor through the first leadframe segment, the capacitor, and the second leadframe segment is less than or equal to approximately one millimeter.

6. The device of claim 1, further comprising an electrical loop comprising the first transistor, the first leadframe segment, the capacitor, and the second leadframe segment, the second transistor, and the conductive element, wherein an inductance of the electrical loop is less than approximately three hundred nanofarads.

7. The device of claim 1, wherein:
   a thickness of the first leadframe segment is greater than one hundred micrometers and less than approximately three hundred micrometers;
   a thickness of the second leadframe segment is greater than one hundred micrometers and less than approximately three hundred micrometers; and
   a thickness of the capacitor is greater than one hundred micrometers and less than approximately two hundred micrometers.

8. The device of claim 1, wherein:
   a distance from the first transistor to the first end of the capacitor is less than approximately four hundred micrometers; and
   a distance from the second transistor to the second end of the capacitor is less than approximately four hundred micrometers.

9. A method comprising:
   electrically connecting a first transistor to a first leadframe segment positioned on a first side of the first transistor;
   electrically connecting a second transistor to a second leadframe segment positioned on a first side of the second transistor, wherein the first side of the first transistor and the first side of the second transistor are a same side;
   electrically connecting a conductive element to the first transistor and the second transistor, wherein the conductive element is positioned on a second side of the first transistor and positioned on a second side of the second transistor, wherein the second side of the first transistor and the second side of the second transistor are a same side;
   electrically connecting a first end of a capacitor to the first leadframe segment; and
   electrically connecting a second end of the capacitor to the second leadframe segment.

10. The method of claim 9, wherein:
electrically connecting the first end of the capacitor to the first leadframe segment comprises etching a portion of the first leadframe segment adjacent to the first transistor; and
electrically connecting the second end of the capacitor to the second leadframe segment comprises etching a portion of the second leadframe segment adjacent to the second transistor.

11. The method of claim 9, wherein:
electrically connecting the first end of the capacitor to the first leadframe segment comprises etching a portion of the first leadframe segment opposite the first transistor; and
electrically connecting the second end of the capacitor to the second leadframe segment comprises etching a portion of the second leadframe segment opposite the second transistor.

12. The method of claim 11, further comprising:
forming a first conductive path through the first leadframe segment; and
forming a second conductive path through the second leadframe segment, wherein:
electrically connecting the first end of the capacitor to the first leadframe segment further comprises electrically connecting the first end of the capacitor to the first conductive path, and
electrically connecting the second end of the capacitor to the second leadframe segment further comprises electrically connecting the second end of the capacitor to the second conductive path.

13. The method of claim 12, wherein:
the first conductive path comprises solder; and
the second conductive path comprises solder.

14. The method of claim 11, further comprising:
encapsulating the first transistor, the second transistor, the first leadframe segment, the second leadframe segment, and the conductive element in a molding compound; and
partially encapsulating the capacitor in the molding compound.

15. The method of claim 14, further comprising:
attaching the first leadframe segment to a printed circuit board (PCB);
attaching the second leadframe segment to the PCB; and
attaching the capacitor to the PCB.

16. The method of claim 9, wherein:
electrically connecting the first transistor to the first leadframe segment comprises soldering the first side of the first transistor to the first leadframe segment;
electrically connecting the second transistor to the second leadframe segment comprises soldering the first side of the second transistor to the second leadframe segment;
electrically connecting the conductive element to the first transistor and the second transistor comprises soldering the conductive element to the second side of the first transistor and the second side of the second transistor;
electrically connecting the first end of the capacitor to the first leadframe segment comprises soldering the first end of the capacitor to the first leadframe segment; and
electrically connecting a second end of the capacitor to the second leadframe segment comprises soldering the second end of the capacitor to the second leadframe segment.

17. The method of claim 9, wherein:
a first distance between the first transistor and the first end of the capacitor is less than approximately four hundred micrometers; and
a second distance between the second transistor and the second end of the capacitor is less than approximately four hundred micrometers.

18. The method of claim 9, wherein a distance from the first transistor through the first leadframe segment, the capacitor, and the second leadframe segment to the second transistor is less than or equal to approximately one millimeter.

19. A power converter device comprising:
a high-side transistor;
an input-voltage leadframe segment positioned on a first side of the high-side transistor, wherein a high-side drain terminal on the first side of the high-side transistor is electrically connected to the input-voltage leadframe segment;
a low-side transistor;
a reference-voltage leadframe segment positioned on a first side of the low-side transistor, wherein a low-side source terminal on the first side of the low-side transistor is electrically connected to the reference-voltage leadframe segment, and wherein the first side of the high-side transistor and the first side of the low-side transistor are a same side;
a conductive element positioned on a second side of the high-side transistor and positioned on a second side of the low-side transistor, wherein the second side of the high-side transistor and the second side of the low-side transistor are a same side, and wherein the conductive element is electrically connected to a high-side source terminal on the second side of the high-side transistor and a low-side drain terminal on the second side of the low-side transistor; and
a capacitor, wherein:
a high side of the capacitor is electrically connected to the input-voltage leadframe segment,
a low side of the capacitor is electrically connected to the reference-voltage leadframe segment,
a first distance between the high-side drain terminal and the high side of the capacitor is less than approximately four hundred micrometers, and
a second distance between the low-side source terminal and the low side of the capacitor is less than approximately four hundred micrometers.

20. The system of claim 19, further comprising an integrated circuit comprising the capacitor and the low-side transistor, wherein a third distance between the high-side transistor and the integrated circuit is less than two hundred micrometers.

* * * * *